United States Patent
Hausdorf et al.

(10) Patent No.: US 7,519,338 B2
(45) Date of Patent: Apr. 14, 2009

(54) APPARATUS AND METHOD FOR PULSE MEASUREMENT

(75) Inventors: Reiner Hausdorf, Ottobrunn (DE); Pavel Baros, Hrušovany n. Jev. (CZ); Leo Brueckner, Brno (CZ)

(73) Assignee: Rohde & Schwarz GmbH & Co. KG, Munich (DE)

( * ) Notice: Subject to any disclaimer, the term of this patent is extended or adjusted under 35 U.S.C. 154(b) by 720 days.

(21) Appl. No.: 11/165,839

(22) Filed: Jun. 23, 2005

(65) Prior Publication Data
US 2006/0057997 A1  Mar. 16, 2006

(30) Foreign Application Priority Data
Sep. 13, 2004  (EP)  ................. 04021741

(51) Int. Cl.
*H04B 17/00*  (2006.01)
(52) U.S. Cl. ................. 455/130; 455/67.11; 455/226.1; 324/76.23; 324/76.27
(58) Field of Classification Search ............. 455/67.11, 455/67.13, 226.1, 226.4; 324/76.19, 76.22–76.23, 324/76.27, 76.29
See application file for complete search history.

(56) References Cited

U.S. PATENT DOCUMENTS

| | | | | |
|---|---|---|---|---|
| 4,272,719 A | | 6/1981 | Niki et al. | |
| 4,839,582 A | * | 6/1989 | Fukaya et al. | 324/76.23 |
| 5,119,018 A | * | 6/1992 | Katayama et al. | 324/76.27 |
| 5,140,703 A | * | 8/1992 | Payne | 455/226.1 |
| 5,210,483 A | * | 5/1993 | Amamoto et al. | 324/76.27 |
| 5,416,798 A | * | 5/1995 | Hirose et al. | 375/227 |
| 5,487,186 A | * | 1/1996 | Scarpa | 455/192.2 |
| 5,869,959 A | * | 2/1999 | Tomikawa | 324/76.27 |
| 2005/0048939 A1 | * | 3/2005 | McMullin et al. | 455/189.1 |

FOREIGN PATENT DOCUMENTS

DE  101 03 481 A1  8/2002

* cited by examiner

*Primary Examiner*—Simon D Nguyen
(74) *Attorney, Agent, or Firm*—Christensen O'Connor Johnson Kindness PLLC

(57) ABSTRACT

A measurement apparatus (1) for measuring peak pulses of a radio frequency input signal ($RF_{input}$) comprises mixing means for mixing the radio frequency input signal ($RF_{input}$) with a local oscillator signal (LO) in order to convert the radio frequency input signal ($RF_{input}$) directly to zero centre frequency thereby suppressing frequency components in a range close to zero frequency. Control means (20) control the frequency ($f_{LO}$) of the local oscillator signal (LO) in a manner that a first measurement is performed in a first frequency range and that a second measurement is performed in a second frequency range shifted from the first frequency range.

12 Claims, 2 Drawing Sheets

(State of the Art)

APPARATUS AND METHOD FOR PULSE MEASUREMENT

The invention relates to pulse measurement, especially but not limited to a so-called quasi-peak measurement. Quasi-peak measurements serve to detect the weighted peak value of the envelope of a radio frequency signal.

From DE 38 17 500 C1 a measurement apparatus for measuring peak pulses is known. This measurement apparatus simply measures the maximum of disturbing peaks but not quasi-peaks. The input radio frequency signal is received by a high frequency receiver and is converted to an intermediate frequency band which has a specific centre frequency significantly above zero frequency. Pulse measurement is then performed in the analogue regime in the intermediate frequency band. Specific intermediate frequency band pass filters are used for filtering the RF signal before the pulse measurement can be performed.

The use of the intermediate frequency section for pulse measurement has the disadvantage that the intermediate frequencies filters are very costly and cannot be easily integrated in digital technology. Thus, it has several advantages to convert the radio frequency input signal directly to zero centre frequency instead of to an intermediate frequency band. The analogue mixing means used for zero mixing, however, need a highpass filter at the output of the mixer to avoid that DC (Direct Current)-components and other low frequency components are transferred to the analogue/digital-converter. This, however, means that the frequency components close to zero frequency are cancelled before they are converted to a digital signal and thus cannot reach the digital detector. This causes a specific failure of the measurement.

A digital detector for quasi-peak measurement is known from DE 101 03 481 A1.

It is the object of the present invention to provide an apparatus and a method making the concept of zero mixing also available for measuring peak pulses having frequency components close to zero frequency.

The object is solved by the features of claim 1 as concerns the apparatus and by the features of claim 9 as concerns the method.

According to the invention frequency shifting means are applied and controlled by control means in a manner that a first measurement is performed in a first frequency range and that a second measurement is performed in a second frequency range shifted from the first frequency range. The inventive apparatus and method thus performs at least two measurements in different frequency ranges. As a consequence the frequency components suppressed by the analogue mixing means do not anymore occur at zero frequency and can thus be measured.

The dependent claims relate to further developments of the invention. Preferably the first and second frequency range overlap and the first and second frequency range both include the range of the frequency components suppressed by the analogue mixing means.

Further, the measurement apparatus preferably comprises a lowpass filter arranged downstream of the frequency shifting means and cut-off frequency of the lowpass filter is several times higher than the highest frequency suppressed by the analogue mixing means.

A preferred embodiment of the invention is now described with reference to the drawing. In the drawing FIG. 1 shows an embodiment of the inventive apparatus;

Figure 1:
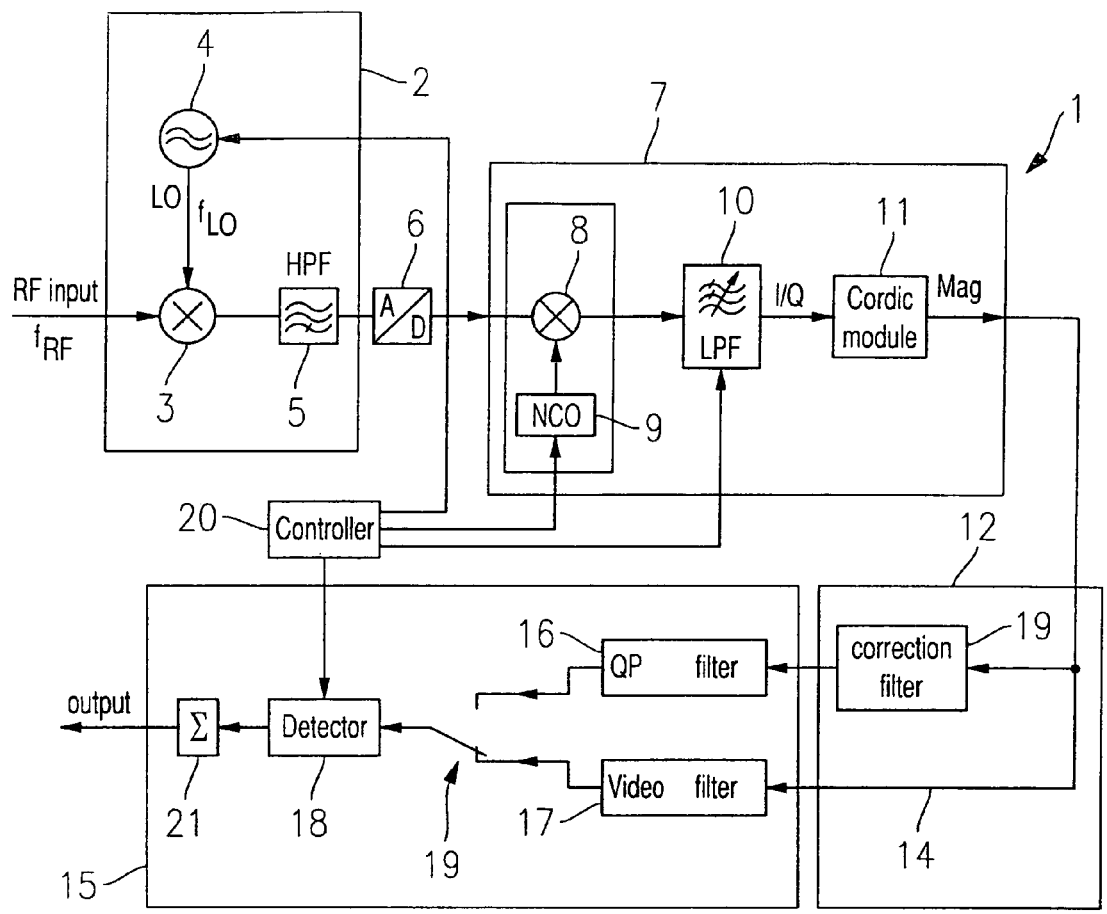

FIG. 1 shows a simplified block diagram of a preferred embodiment of the inventive measurement apparatus 1 for measuring peak pulses, especially quasi-peaks, of a radio frequency input signal. The radio frequency input signal $RF_{input}$ has a centre frequency of $f_{RF}$ and is supplied to analogue mixing means 2. Analogue mixing means 2 comprises a mixer 3 supplied with the radio frequency input signal $RF_{input}$ and supplied with a local oscillator signal LO generated by a local oscillator 4 and having a frequency $f_{LO}$. The analogue mixing means 2 further have a highpass filter (HPF) 5 suppressing frequency components in the range close to zero frequency, especially the DC (Direct (Current)-component. An analogue/digital-converter 6 is connected with the output of the mixing means 2 and converts the analogue signal to a digital signal.

The frequency $f_{LO}$ is normally exactly identical and according to the invention nearly identical with the centre frequency $f_{RF}$ of the radio frequency input signal $RF_{input}$. Consequently, the analogue mixing means 2 converts the radio frequency input signal $RF_{input}$ directly to zero centre frequency. As the radio frequency input signal $RF_{input}$ is not converted to an intermediate frequency but directly to zero frequency, costly intermediate frequency filters can be avoided and the overall manufacturing costs for the inventive measurement apparatus 1 can be significantly reduced. However, as the analogue mixing means suppresses the frequency components close to zero frequency, these frequency components cause a failure of the measurement result. According to the invention this failure can be avoided as is explained later on.

A first digital unit 7 comprises a digital multiplier 8 supplied with the digital signal from the analogue/digital-converter 6 and with a digital signal from a numerically controlled oscillator 9. The digital mixer 8 is followed by an adjustable digital lowpass filter 10 for lowpass filtering the digital signal. It should be noted that the digital signal is a complex baseband signal with an inphase I-component and a quadrature phase Q-component as indicated at the output of the lowpass filter 10. The lowpass filter 10 is followed by a cordic module 11 which converts the cartesian coordinates to polar coordinates with magnitude Mag and phase angle φ.

The magnitude Mag is transferred to a second digital unit 12 comprising a correction filter 13 which can be bypassed by bypass line 14. The correction filter 13 has an inverse pulse response with respect to the lowpass filter 10 and corrects any distortion of digital signals caused by the lowpass filter 10.

In a third digital unit 15 a quasi-peak filter 16 and a video filter 17 are provided. A detector 18 can be switched by switch means 19 between the output of the quasi-peak filter 16 and the video filter 17. The input of the quasi-peak filter 16 is connected via the correction filter 13 with the output of the cordic module 11. The input of the video filter 17 is connected directly via bypass line 14 with the output of the cordic module 11. Detector 18 and quasi-peak filter 16 form a quasi-peak detector means for performing quasi-peak measurements. It should be noted, however, that the present application especially apply to but are not limited to quasi-peak measurement and can be used also for other pulse measurements.

The frequency $f_{LO}$ of local oscillator signal LO generated by the local oscillator 4 is controlled by control means 20. Control means 20 can also control other devices of the measurement apparatus 1, especially the frequency generated by numerical controlled oscillator 9, the cut-off frequency of lowpass filter 10 and the gating of detector 18.

The quasi-peak detector means 16, 18 transform the envelope of the signal into an output signal level that is adapted to the psychophysical perceptual response of the human ear or human eye. The specification of such quasi-peak detectors can be found in "IEC CISPR 16-1/1999-10", "Specification of Radio Disturbance and Immunity Measuring Apparatus and Methods", Part 1: "Radio Disturbance and Immunity Measuring Apparatus". The human ear or human eye perceives interference pulses of the same amplitude to be the more disturbing the higher the rate of repetition of the interference pulses is. The purpose of the quasi-peak means 16, 18 is to simulate this subjective perceptual response of the human ear or human eye.

Figure 3:
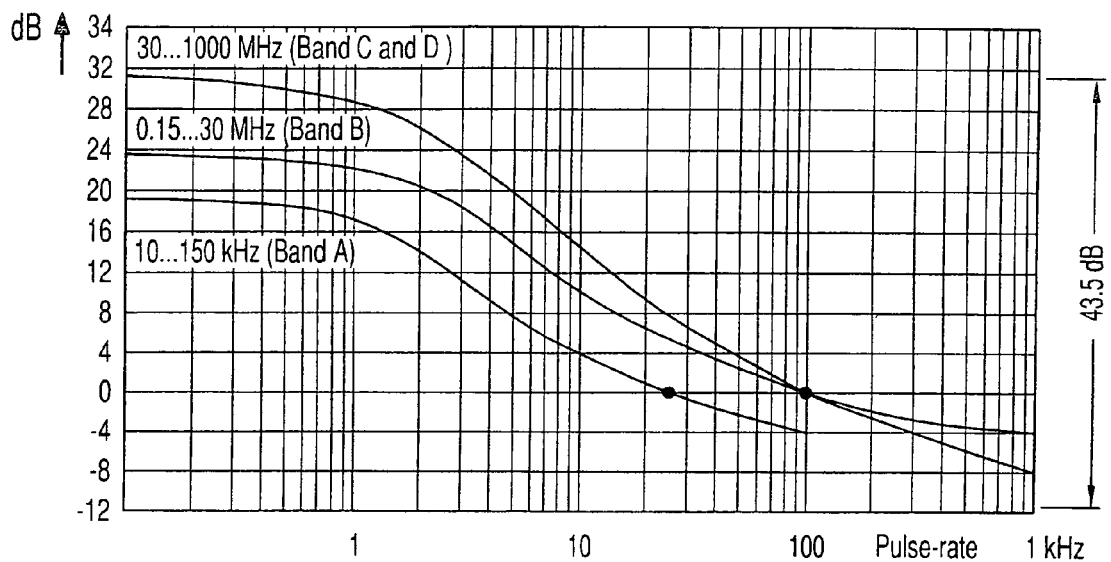
FIG. 3 shows the frequency behaviour of the quasi-peak detector means.

FIG. 3 shows the behaviour of a quasi-peak detector as demanded in the aforementioned specification. Represented is the level of the input-side noise voltage that is required in order to obtain an equal output level in each case at the output of the quasi-peak detector as a function of the pulse-rate (rate of repetition) of the noise voltage. In this figure it can be discerned that the quasi-peak detector requires a higher noise voltage at a low pulse-rate in order to obtain a certain output level than at a higher pulse-rate. Expressed differently, the quasi-peak detector is more sensitive to noise voltages with a relatively high pulse-rate.

Figure 2:
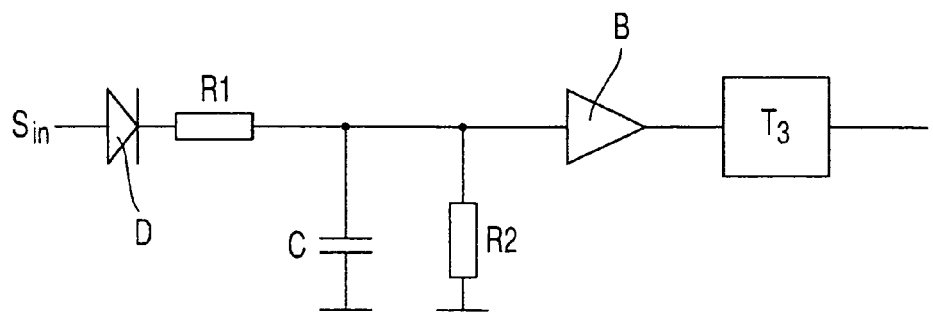
FIG. 2 shows an analogue equivalent circuit of the quasi-peak detector means.

Quasi-peak detectors have previously been constructed in analogue design in a manner such as is evident from FIG. 2. The input signal $S_{in}$ is rectified at a diode D and supplied to a capacitor C via a charging resistor R1. During each half-wave of the input signal $S_{in}$ the capacitor C is consequently charged via the charging resistor R1. Discharge of the capacitor C is effected via a discharging resistor R2 connected parallel to the capacitor C. Downstream of the buffer B a measuring instrument, for example a moving-iron instrument, can be directly connected. This has been implemented in this way mainly in the early days of quasi-peak measurements. In more recent times, evaluation has been made electronically by using an analogue low-pass filter $T_3$, which simulates the response of the measuring instrument and is connected downstream of the buffer B. Consequently the circuit has three time constants: a charging time constant $\tau_1 = R1 \cdot C$, a discharging time constant $\tau_2 = R2 \cdot C$ and a damping time constant $\tau_3$ of the damping element $T_3$.

In connection with the analogue realisation of a quasi-peak detector the following problems arise: for an exact measurement the diode D has to be compensated. Due to the large discharging time constant $\tau_2$, the capacitor has to be of high quality, i.e. it has to be able to retain the charge over a relatively long period (several seconds) without significant losses. As FIG. 3 shows, the sensitivity of the quasi-peak detector is specified differently for different frequency bands, so a different circuit has to be employed for each frequency band. Long term stability and temperature stability are difficult to attain. Tuning of the detector and range-switching turn out to be difficult.

DE 101 03 481 A1 shows a digital implementation of a quasi-peak detector. Quasi-peak detector means 16, 18 shown in FIG. 1 of the present application can be implemented for example in this way.

In DE 101 03 481 A1 a digital charging filter which simulates the process for charging the capacitor, a digital discharging filter which simulates the process for discharging the capacitor, and a digital attenuating filter which simulates the attenuation response of the measuring instrument, are applied instead of the analogue components represented in FIG. 2. The digital realisation of the quasi-peak detector permits measurements with a high degree of precision. The digital charging filter and the digital discharging filter are implemented as first-order IIR (Infinite Impulse Response) filters. The digital attenuating filter is implemented as a second-order IIR (Infinite Impulse Response) filter and implements two critically coupled first-order low-pass filters. The digital input filter is likewise realised as a second-order IIR (Infinite Impulse Response) filter.

Figure 4A:
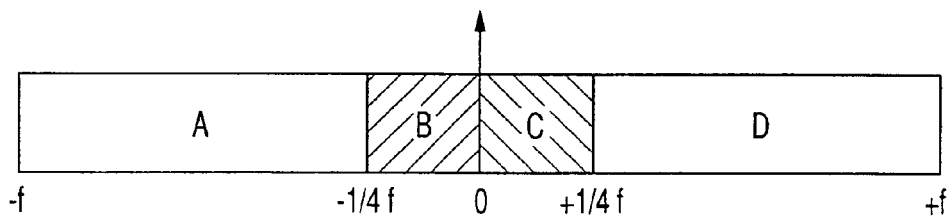
FIG. 4A-4C shows frequency diagrams used to explain the principle of the present invention.
Figure 4B:
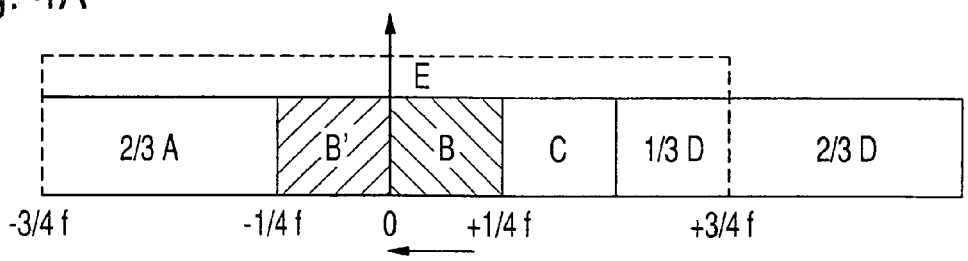
Figure 4C:
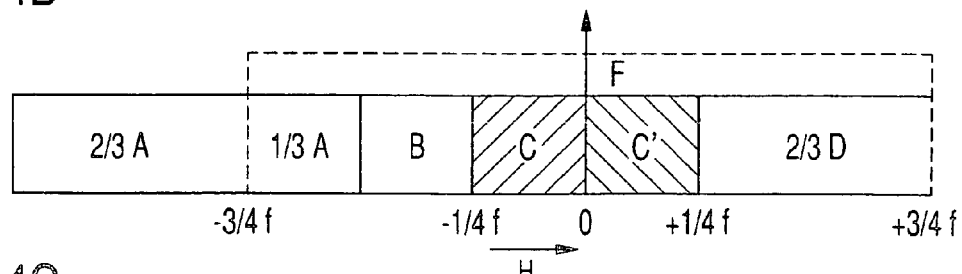

With respect to FIGS. 4A, 4B and 4C the principle of the invention is now described. FIG. 1 shows the frequency domain with the typical configuration of highpass filter 5 of analogue mixing means 2 and of digital lowpass filter 10. The cut-off frequency of lowpass filter 10 is designated as f and thus the total frequency range passing through lowpass filter 10 is the range between −f and +f. Highpass filter 5, however, suppresses frequency components in the range B and C close to zero frequency 0. In the example shown in FIG. 4A the cut-off frequency of lowpass filter 10 is four times of the cut-off frequency of highpass filter 5 and thus, the cut-off frequency f of lowpass filter 10 is four times of the highest frequency suppressed by the mixing means 2.

As frequency ranges B and C do not pass through highpass filter 5, these frequency components are not converted by analogue/digital-converter 6 and thus at the output of lowpass filter 10 only frequency ranges A and D occur. Only these frequency ranges A and D are transferred through cordic module 11 and correction filter 13 to the quasi-peak filter 16. Thus, only these frequency ranges A and D contribute to the signal detected by detector 18. This leads to significant failure of the pulse measurement. It should be noted that this problem only occurs because zero-mixing is used in mixing means 2 and this problem would not occur if mixing means 2 converted the radio frequency input signal $RF_{input}$ to an intermediate frequency band as in conventional measurement arrangements. Thus, in order to make zero-mixing available for pulse measurement the above described problem has to be solved.

The invention proposes the following solution: The controller 20 controls the frequency $f_{LO}$ of the local oscillator signal generated by local oscillator 4 in a manner that a first measurement is performed in a first frequency range E, shown in FIG. 4B, and that at least a second measurement is performed in a second frequency range F, shown in FIG. 4C, shifted from the first frequency range E.

As can be seen from FIG. 4B during a first measurement the frequency $f_{LO}$ generated by the local oscillator 4 is not exactly identical with the centre frequency $f_{RF}$ of the radio frequency input signal $RF_{input}$ but is shifted by a negative frequency shift of −¼ f as indicated by arrow G in FIG. 4B. Thus, the first frequency range E of the first measurement covers the interval from −¾ f to +¾ f on the shifted frequency scale shown in FIG. 4B, that is the interval from −f to +½ f on the unshifted frequency scale shown in FIG. 4A. Thus, the first frequency range of the first measurement covers frequency ranges ⅔ A, C and ⅓ D as indicated in FIG. 4B. It should be noted that frequency range ⅔ D is not covered by the frequency range E of the first measurement due to frequency shift indicated by arrow G. Further, it should be noted that highpass filter 5 of analogue mixing means 2 suppresses the frequency ranges B' and B during the first measurement as shown in FIG. 4B.

As can be seen from FIG. 4C during a second measurement the frequency $f_{LO}$ generated by a local oscillator 4 is also not exactly identical with the centre frequency $f_{RF}$ of the radio frequency input signal $RF_{input}$ but is shifted by a positive frequency shift of +¼ f as indicated by arrow H in FIG. 4C. Thus, the second frequency range F of the second measurement covers the interval from −¾ f to +¾ f on the shifted frequency scale shown in FIG. 4C that is the interval from $-\frac{1}{2}$ f to +f on the unshifted frequency scale shown in FIG. 4A. Thus, the second frequency range of the second measurement covers frequency ranges ⅓ A, B and ⅔ D as indicated in FIG. 4C. It should be noted that frequency range ⅔ A is not covered by the frequency range F of the second measurement due to frequency shift indicated by arrow H. Further, it should be noted that highpass filter 5 of analogue mixing means 2 suppresses the frequency ranges C and C' during the second measurement as shown in FIG. 4C.

The results of both measurements shown in FIGS. 4B and 4C are added in adder means 21. Consequently, the frequency range of the added result covers the superposition of frequency ranges E and F. As frequency range C is covered by the first measurement shown in FIG. 4B and frequency range B is covered by the second measurement shown in FIG. 4C, frequency components close to zero frequency within these frequency ranges B and C are covered by the superposition of the two measurements. It should be noted that the frequency shift G and H should be at least as large as the cut-off frequency of the highpass filter 5, which is ¼ f in the shown example. In order to improve the reliability of the inventive method this frequency shift should be at least a little bit higher.

In a preferred embodiment the first frequency range E and the second frequency range F are both shifted in different directions from a zero position in which the frequency $f_{LO}$ of the local oscillator signal LO is identical with the centre frequency $f_{RF}$ of the radio frequency input signal $RF_{input}$.

Preferably the first frequency range E and the second frequency range F are shifted by the same value in different directions.

The invention is not restricted to the embodiment shown in the drawings and described above. Especially it is not necessary that the frequency ranges E and F of both measurements are both shifted from the zero frequency position. For instance, the first measurement could be performed without shifting the frequency $f_{LO}$ of local oscillator 4 if the frequency shift H of the second measurement is doubled to ½ f in the example.

The invention claimed is:

1. A measurement apparatus for measuring peak pulses of a radio frequency input signal ($RF_{input}$) comprising:
    mixing means for mixing the radio frequency input signal ($RF_{input}$) with a local oscillator signal (LO) in order to convert the radio frequency input signal ($RF_{input}$) directly to zero centre frequency thereby suppressing frequency components in a range (B, C) close to zero frequency; and
    control means for controlling the frequency ($f_{LO}$) of the local oscillator signal (LO) in a manner that a first measurement is performed in a first frequency range (E) and that at least a second measurement is performed in a second frequency range (F) shifted with respect to the first frequency range (E);
    wherein the measurement apparatus further comprises a low-pass filter downstream of the mixing means;
    wherein a cut-off frequency of the low-pass filter is 3 to 10 times the highest frequency suppressed by the mixing means; and
    wherein the highest frequency suppressed by the mixing means is about ¼ the cut-off frequency of the low-pass filter.

2. Measurement apparatus according to claim 1, characterized in that the first and second frequency range (E, F) overlap.

3. Measurement apparatus according to claim 2, characterized in that the first and second frequency range (E, F) both include the range (B, C) of the frequency components suppressed by said mixing means.

4. Measurement apparatus according to claim 1, characterized in that the mixing means comprises a mixer, a local oscillator generating the local oscillator signal (LO) and a highpass filter arranged downstream of the mixer.

5. Measurement apparatus according to claim 1, characterized in that the results of the first measurement detected by a detector means and the result of the second measurement detected by the detector means are added.

6. Measurement apparatus according to claim 5, characterized in that the detector means comprises a quasi-peak filter for detecting quasi-peaks.

7. Method for measuring peak pulses of a radio frequency input signal ($RF_{input}$) using a measurement apparatus comprising mixing means for mixing the radio frequency input signal ($RF_{input}$) with a local oscillator signal (LO) in order to convert the radio frequency input signal ($RF_{input}$) directly to zero centre frequency thereby suppressing frequency components in a range (B, C) close to zero frequency;
    wherein the frequency ($f_{LO}$) of the local oscillator signal (LO) is controlled in a manner that a first measurement is performed in a first frequency range (E) and that at least a second measurement (F) is performed in a second frequency range shifted with respect to the first frequency range (E);
    wherein the measurement apparatus further comprises a low-pass filter downstream of the mixing means;
    wherein a cut-off frequency of the low-pass filter is 3 to 10 times the highest frequency suppressed by the mixing means; and
    wherein the highest frequency suppressed by the mixing means is about ¼ the cut-off frequency of the low-pass filter.

8. Method according to claim 7, characterized in that the first and second frequency range (E, F) overlap.

9. Method according to claim 8, characterized in that the first and second frequency range (E, F) both include the range (B, C) of the frequency components suppressed by the mixing means.

10. Method according to claim 7, characterized in that the results of the first and at least second measurement detected by detector means of the measurement apparatus are added.

11. Method according to claim 7, characterized in that the first frequency range (E) and the second frequency range (F) are both shifted in different directions from a zero position, in which the frequency ($f_{LO}$) of the local oscillator signal (LO) is identical with the centre frequency ($f_{RF}$) of the radio frequency input signal ($RF_{input}$).

12. Method according to claim 11, characterized in that the first frequency range (E) and the second frequency range (F) are shifted by the same value in different directions.

* * * * *